(12) United States Patent
Kim et al.

(10) Patent No.: US 11,982,980 B2
(45) Date of Patent: May 14, 2024

(54) SIMULATION METHOD FOR SEMICONDUCTOR FABRICATION PROCESS AND METHOD FOR MANUFACTURING SEMICONDUCTOR DEVICE

(71) Applicant: Samsung Electronics Co., Ltd., Suwon-si (KR)

(72) Inventors: Jinwoo Kim, Hwaseong-si (KR); Sanghoon Myung, Goyang-si (KR); Wonik Jang, Suwon-si (KR); Yongwoo Jeon, Seoul (KR); Kanghyun Baek, Seoul (KR); Jisu Ryu, Hwaseong-si (KR); Changwook Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 392 days.

(21) Appl. No.: 17/230,275

(22) Filed: Apr. 14, 2021

(65) Prior Publication Data
US 2022/0043405 A1    Feb. 10, 2022

(30) Foreign Application Priority Data
Aug. 10, 2020  (KR) .................. 10-2020-0100042

(51) Int. Cl.
*G05B 13/04* (2006.01)
*G05B 13/02* (2006.01)
(Continued)

(52) U.S. Cl.
CPC ......... *G05B 13/042* (2013.01); *G05B 13/027* (2013.01); *G06N 3/045* (2023.01); *H01L 27/0207* (2013.01)

(58) Field of Classification Search
None
See application file for complete search history.

(56) References Cited

U.S. PATENT DOCUMENTS 8,832,006 B2    9/2014  Morinaga et al.
10,018,996 B2   7/2018  Bomholt et al.
(Continued)

FOREIGN PATENT DOCUMENTS

KR    1020210071130 A    6/2021

OTHER PUBLICATIONS

Fan et al., "Data-Driven Approach for Fault Detection and Diagnostic in Semiconductor Manufacturing," IEEE, 2020, 12pg. (Year: 2020).*

(Continued)

*Primary Examiner* — Ryan D. Coyer
(74) *Attorney, Agent, or Firm* — Myers Bigel, P.A.

(57) ABSTRACT

According to an aspect of the present inventive concept, a simulation method for a semiconductor fabrication process includes obtaining, as input data, process parameters for controlling a semiconductor process of manufacturing semiconductor devices, or design parameters representing a structure of the semiconductor devices, or both the process parameters and the design parameters; generating predictive data for electrical characteristics of the semiconductor devices using a machine learning model based on the input data; generating reference data for the electrical characteristics of the semiconductor devices using a simulation tool based on the input data; and training the machine learning model using the predictive data and the reference data.

18 Claims, 15 Drawing Sheets

(51) Int. Cl.
*G06N 3/045* (2023.01)
*H01L 27/02* (2006.01)

(56) References Cited

U.S. PATENT DOCUMENTS

| | | | |
|---|---|---|---|
| 10,235,489 B2 | 3/2019 | Tirapu Azpiroz et al. | |
| 10,614,186 B2 | 4/2020 | Kim et al. | |
| 10,621,494 B2 | 4/2020 | Xu et al. | |
| 11,348,017 B1* | 5/2022 | Wong | G06N 20/00 |
| 2008/0155444 A1 | 6/2008 | Pannese et al. | |
| 2017/0193400 A1* | 7/2017 | Bhaskar | G01Q 30/02 |
| 2018/0341248 A1* | 11/2018 | Mehr | G05B 19/4099 |
| 2019/0147127 A1* | 5/2019 | Su | G06N 20/00 703/7 |
| 2019/0257767 A1* | 8/2019 | Shaubi | G06T 7/0004 |
| 2019/0385047 A1 | 12/2019 | Lei et al. | |
| 2019/0385695 A1 | 12/2019 | Jeong et al. | |
| 2020/0004918 A1* | 1/2020 | Sha | G03F 7/705 |
| 2020/0082051 A1 | 3/2020 | Kwon et al. | |
| 2020/0105500 A1* | 4/2020 | Chou | H01J 37/28 |
| 2020/0110913 A1 | 4/2020 | Wu et al. | |
| 2020/0273210 A1* | 8/2020 | Nguyen | G06T 9/20 |
| 2021/0073669 A1* | 3/2021 | Banerjee | G06N 3/045 |
| 2021/0174201 A1* | 6/2021 | Huh | G06F 18/24143 |
| 2022/0092388 A1* | 3/2022 | Mei | G06N 20/00 |
| 2023/0092066 A1* | 3/2023 | Cella | G06N 3/044 |

OTHER PUBLICATIONS

Munirathinam et al., "Predictive Models for Equipment Fault Detection in the Semiconductor Manufacturing Process," IACSIT, 2014, 14pg. (Year: 2014).*
Abdelghany et al,. "Implementing Machine Learning OPC on product layouts," SPIE, Mar. 2020. (Year: 2020).*
Hooker et al., "Implementing Machine Learning for OPC retargeting," SPIE, Mar. 2020. (Year: 2020).*
Weichert et al., "A review of machine learning for the optimization of production processes," Springer, 2019. (Year: 2019).*

* cited by examiner

| Vd\Vg | 0.5 | 1.0 | 1.5 | 2.0 | 2.5 | 3.0 | 3.5 | 4.0 | 4.5 | 5.0 |
|---|---|---|---|---|---|---|---|---|---|---|
| 1.0 | 2 | 2.2 | 2.2 | 2.2 | 2.2 | 2.2 | 2.2 | 2.2 | 2.2 | 2.2 |
| 2.0 | 3 | 4 | 4 | 4 | 4 | 4 | 4 | 4 | 4 | 4 |
| 3.0 | 5 | 8.5 | 9 | 9 | 9 | 9 | 9 | 9 | 9 | 9 |
| 4.0 | 6.5 | 12 | 14.5 | 16 | 16 | 16 | 16 | 16 | 16 | 16 |
| 5.0 | 9.5 | 16 | 21.5 | 24 | 25 | 25 | 25 | 25 | 25 | 25 |
| 6.0 | 11 | 20 | 26.5 | 33 | 34.5 | 36 | 36 | 36 | 36 | 36 |
| 7.0 | 14 | 24.5 | 32.5 | 40 | 44 | 46.5 | 48 | 48 | 48 | 48 |

SIMULATION METHOD FOR SEMICONDUCTOR FABRICATION PROCESS AND METHOD FOR MANUFACTURING SEMICONDUCTOR DEVICE

CROSS-REFERENCE TO RELATED APPLICATION(S)

This application claims benefit of priority to Korean Patent Application No. 10-2020-0100042 filed on Aug. 10, 2020 in the Korean Intellectual Property Office, the disclosure of which is incorporated herein by reference in its entirety.

BACKGROUND

1. Field

The present inventive concept relates to a simulation method for semiconductor devices formed by a semiconductor fabrication process and a method for manufacturing a semiconductor device.

2. Description of Related Art

The semiconductor fabrication process may be performed based on layout data. Various patterns constituting semiconductor devices may be formed on a semiconductor substrate by an exposure process in which layout data is transferred to generate a mask, and processes, such as etching and deposition using a mask, may be performed in the exposure process. A physical model-based simulation can be performed using process parameters and design parameters so that each of the semiconductor devices can have desired characteristics, but it can be time consuming and expensive to find the optimal variables in each of the process parameters and design parameters using simulations based on physical models.

SUMMARY

An aspect of the present inventive concept is to provide a method for effectively conducting a simulation based on a process parameter of a semiconductor fabrication process and a design parameter of the semiconductor devices to be manufactured by the semiconductor process using a machine learning model.

According to an aspect of the present inventive concept, a simulation method for a semiconductor fabrication process includes obtaining, as input data, process parameters for controlling a semiconductor process of manufacturing semiconductor devices, or design parameters representing a structure of the semiconductor devices, or both the process parameters and the design parameters; generating predictive data for electrical characteristics of the semiconductor devices using a machine learning model based on the input data; generating reference data for the electrical characteristics of the semiconductor devices using a simulation tool based on the input data; and training the machine learning model using the predictive data and the reference data.

According to an aspect of the present inventive concept, a simulation method for a semiconductor fabrication process includes generating predictive data for electrical characteristics of semiconductor devices using a machine learning model based on input data comprising process variables for controlling a semiconductor fabrication process, or design variables representing a structure of the semiconductor devices, or both the process variables and the design variables; comparing the predictive data with target data for the electrical characteristics of the semiconductor devices; adjusting one of the process variables, or one of the design variables, or both of the one of the process variables and the one of the design variables, such that a difference between the predictive data and the target data is less than or equal to a predetermined threshold difference; and performing the semiconductor fabrication process using the one of the process variables that was adjusted, or the one of the design variables that was adjusted, or both of the one of the process variables that was adjusted and the one of the design variables that was adjusted.

According to an aspect of the present inventive concept, a method for manufacturing a semiconductor device includes generating output data representing characteristics of semiconductor devices using a machine learning model based on input data comprising process parameters for controlling a semiconductor process of manufacturing the semiconductor devices, or design parameters representing a structure of the semiconductor devices, or both the process parameters and the design parameters: generating reference data for the electrical characteristics of the semiconductor devices using a simulation tool based on the input data; training the machine learning model using the output data and the reference data; generating predictive data for electrical characteristics of the devices by inputting process variables for controlling the semiconductor process, or design variables for designing the semiconductor devices, or both of the process variables and the design variables; adjusting one of the process variables, or one of the design variables, or both of the one of the process variables and the one of the design variables until a difference between target data for the electrical characteristics of the semiconductor devices and the predictive data is less than or equal to a predetermined threshold difference; and performing the manufacturing process by using the one of the process variables that was adjusted, the one of the design variables that was adjusted, or both of the one of the process variables that was adjusted and the one of the design variables that was adjusted.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
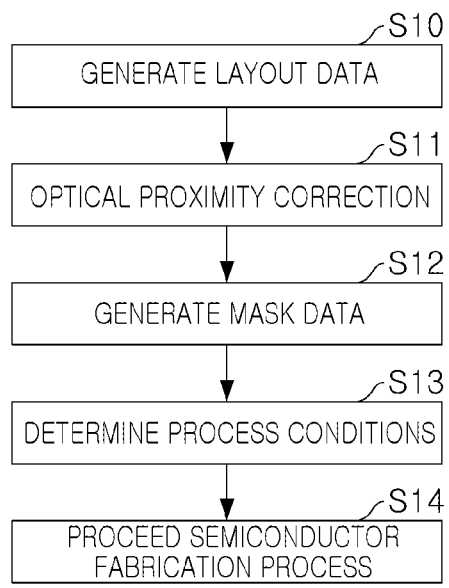
FIG. 1 is a flowchart that illustrates a method for manufacturing a semiconductor device according to an example embodiment of the present inventive concept.

Hereinafter, example embodiments of the present inventive concept will be described with reference to the accompanying drawings. The same reference numerals are used for the same elements in the drawings, and redundant descriptions thereof will be omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination.

FIG. 1 is a flowchart that illustrates a method for manufacturing a semiconductor device according to an example embodiment of the present inventive concept.

A semiconductor fabrication process for manufacturing a semiconductor device includes various processes, such as a deposition process, an etching process, and a polishing process, and various semiconductor devices and wirings connecting the semiconductor devices may be formed by the semiconductor fabrication process. Referring to FIG. 1, to manufacture a semiconductor device, layout data may be generated (S10). For example, the layout data may be provided as data in a graphic design system (GDS) format, and according to example embodiments, a design rule check (DRC) for the layout data and/or a layout versus schematic (LVS) or the like validation may be performed to verify whether the layout data matches an originally intended design may. When the layout data is determined and validated through the above-described processes, optical proximity correction (OPC) is performed on the layout data (S11) and mask data may be generated (S12).

Thereafter, various semiconductor processes may be performed using the mask data. For example, an exposure process, an etching process, and a deposition process may be performed using the mask data. Process conditions may be determined so that a semiconductor device having desired characteristics is formed through a semiconductor process using mask data (S13). For example, the process conditions may include various conditions, such as, for example, a temperature and/or pressure inside a chamber in which a semiconductor process is performed, an intensity of an electric field accelerating particles in an etching process, and/or an ion implantation process.

When the process conditions are determined, the semiconductor fabrication process may proceed accordingly (S14). Even in the same semiconductor fabrication process, semiconductor devices having different characteristics may be formed according to various process conditions. For example, even for electrical field effect transistors formed by the same ion implantation process, deposition process, and etching process, electrical characteristics such as a current-voltage curve and/or a threshold voltage may differ between the various field effect transistors according to differences in process conditions. Structural characteristics of semiconductor devices may also vary according to differences in process conditions.

In an example embodiment of the present inventive concept, to predict the shape and/or characteristics of semiconductor devices formed by a semiconductor fabrication process, a method of predicting the shape and/or characteristics of semiconductor devices in advance may be used. For example, in an example embodiment of the present inventive concept, the shape and/or characteristics of semiconductor devices may be predicted using a machine learning model. For example, in order to accurately predict the electrical characteristics of semiconductor devices, a machine learning model may be trained in advance by using the electrical characteristics of semiconductor devices predicted using a simulation tool such as a Technology Computer Aided Design (TCAD). Embodiments of the inventive concept are described herein in the context of a semiconductor fabrication process simulation system that includes one or more machine learning engines. It will be understood that embodiments of the inventive concept are not limited to particular implementations of the semiconductor fabrication process simulation system and various types of Artificial Intelligence (AI) systems may be used including, but not limited to, a multi-layer neural network, a deep learning system, a natural language processing system, and/or computer vision system. Moreover, it sill be understood that the multi-layer neural network is a multi-layer artificial neural network comprising artificial neurons or nodes and does not include a biological neural network comprising real biological neurons. Embodiments of the inventive concept may be implemented using multiple AI systems or may be implemented by combining various functionalities into fewer or a single AI system. The machine learning model in which training has been completed may receive at least one of design variables representing structures of semiconductor devices to be formed by a semiconductor fabrication process and/or process variables for controlling a semiconductor process, and may predict characteristics of semiconductor devices formed in the fabrication process. For example, when the semiconductor device is a transistor, the machine learning model may output predictive data on a threshold voltage of the transistor, a current flowing in each of the turn-on and turn-off states, and/or the channel length and junction depth of the transistor. The predictive data may be computed with target data predetermined in the process of designing the semiconductor device, and an optimization operation of adjusting design variables and/or process variables may be performed until the predictive data matches the target data or the difference falls below a predetermined range. By performing a semiconductor process based on the adjusted design variables and/or process variables, semiconductor devices having characteristics suitable for target data may be formed.

Figure 2:
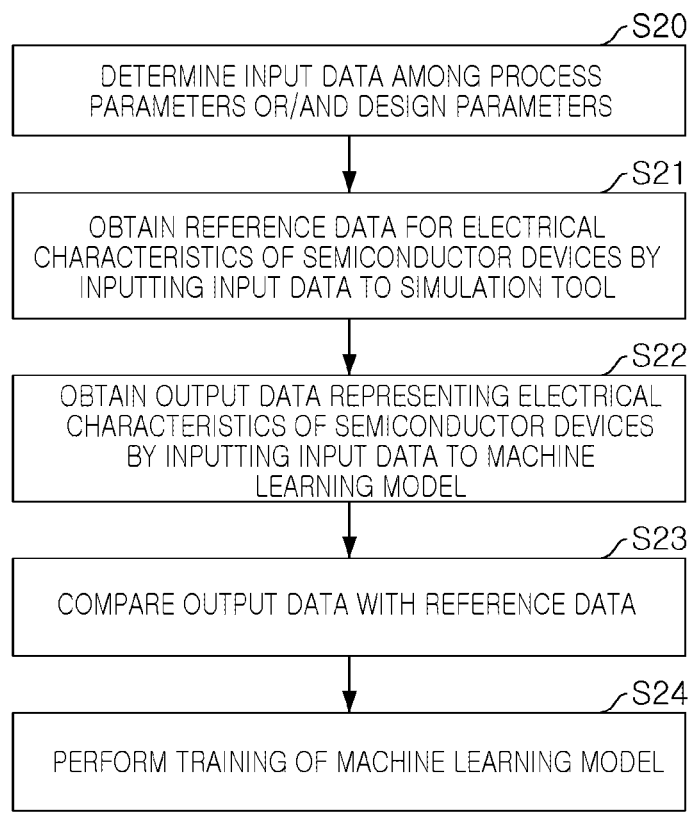
FIG. 2 is a flowchart that illustrates a simulation method for semiconductor devices formed in a semiconductor fabrication process according to an example embodiment of the present inventive concept.

FIG. 2 is a flowchart that illustrates a simulation method for semiconductor devices formed in a semiconductor fabrication process according to an example embodiment of the present inventive concept.

Referring to FIG. 2, operations of a simulation method for a semiconductor fabrication process according to an example embodiment of the present inventive concept may begin by determining input data among process parameters and/or design parameters (S20). Process parameters are parameters for controlling a semiconductor fabrication process, and may include a temperature and/or pressure of a process chamber in which a semiconductor fabrication process is performed, a magnitude of power applied to the process chamber, and the like. Design parameters may be parameters representing the structure of semiconductor devices to be manufactured by a semiconductor fabrication process. For example, when the semiconductor device is a field effect transistor, design parameters may include a thickness of a gate insulating film, a length of a channel, a depth of a junction, and the like.

Process parameters and/or design parameters determined as input data at block S20 may be input to a simulation tool. The simulation tool may be a simulation tool based on a physical model, and may output electrical characteristics of semiconductor devices to be manufactured through a semiconductor fabrication process using the input process parameters and/or design parameters provided as input to the simulation tool. The output of the simulation tool may be applied as reference data for electrical characteristics of semiconductor devices (S21).

Process parameters and/or design parameters determined as input data at block S20 may be input to a machine learning model. The machine learning model receiving input data may generate output data representing electrical characteristics of semiconductor devices (S22) fabricated based on the process parameters and/or design parameters. For example, a machine learning model configured to receive process parameters and/or design parameters may include an artificial neural network implemented by a fully connected network and a convolution neural network. The artificial neural network may include a plurality of hidden layers.

The output data generated by the machine teaming model at block S22 may be compared with reference data obtained as a simulation result of the simulation tool at block S21 (S23). A predetermined loss function may be applied to the comparison between the predictive data and the reference data, and training of the machine learning model may proceed by comparing a function value of the loss function with a predetermined reference value (S24). For example, if the function value of the loss function is greater than the reference value, among hidden nodes included in the hidden layers of the machine learning model, the machine learning model may be adjusted by changing at least one weight value or at least one of fitters included in the machine learning model. If the function value of the loss function is less than the reference value, the machine learning model may be terminated.

Figure 3:
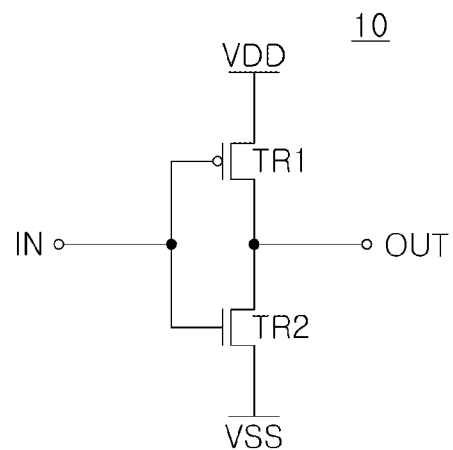
FIG. 3 is a circuit diagram of a semiconductor device according to an example embodiment of the present inventive concept.
Figure 4:
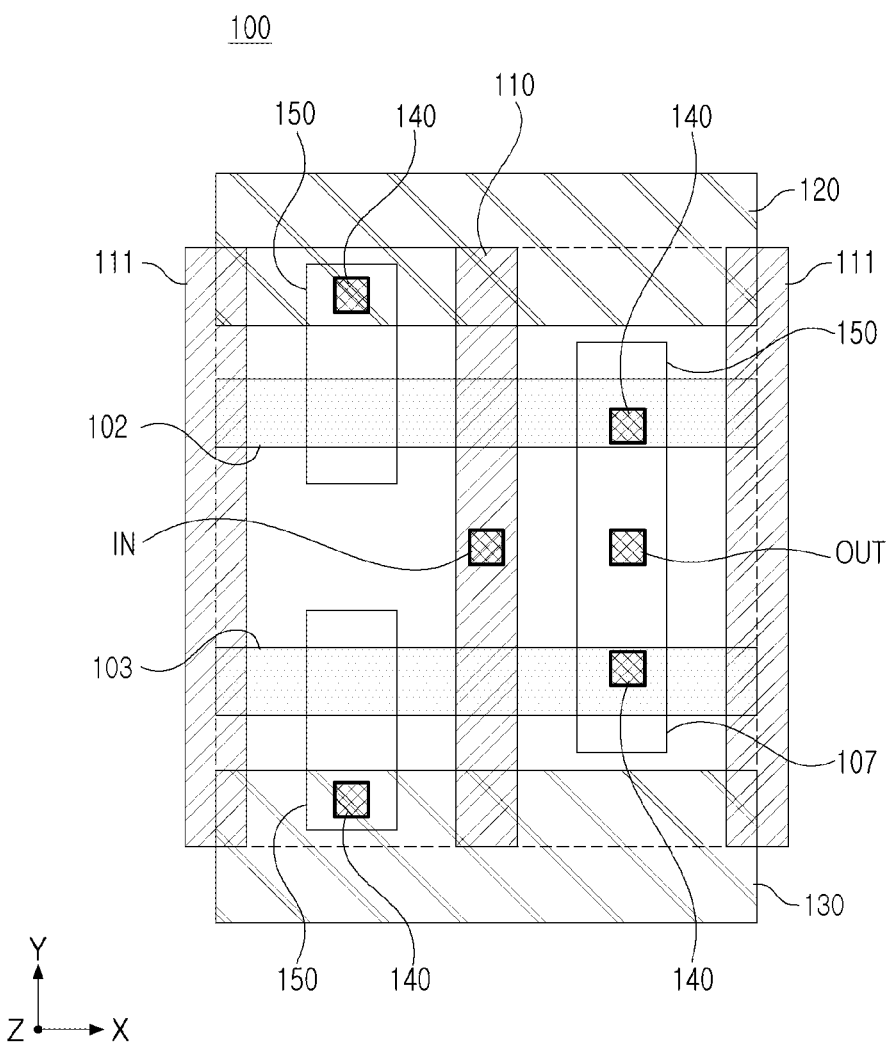
FIG. 4 is a plan view of a semiconductor device according to an example embodiment of the present inventive concept.

FIG. 3 is a circuit diagram of a semiconductor device according to an example embodiment of the present inventive concept. FIG. 4 is a plan view of a semiconductor device according to an example embodiment of the present inventive concept.

Referring to FIGS. 3 and 4, a semiconductor device according to an example embodiment of the present inventive concept may include an inverter. FIG. 3 is a view illustrating an inverter circuit, and FIG. 4 is a plan view illustrating a layout for implementing an inverter according to an example embodiment.

Referring to FIG. 3, an inverter 10 may include a first transistor TR1 receiving a first power voltage VDD and a second transistor TR2 receiving a second power voltage VSS. The first transistor TR1 may be a PMOS device and the second transistor TR2 may be an NMOS device, and a gate of the first transistor TR1 and a gate of the second transistor TR2 may be commonly connected to an input node IN. The first transistor TR1 and the second transistor TR2 may be connected to each other at an output node OUT.

When an input signal input through the input node IN changes from a low level to a high level, the first transistor TR1 is turned off and the second transistor TR2 is turned on so that an output signal may decrease to a low level. Conversely, when an input signal changes from a high level to a low level, the first transistor TR1 is turned on and the second transistor TR2 is turned off, so that an output signal may increase to a high level. Therefore, when the threshold voltages of the first transistor TR1 and the second transistor TR2 are not properly controlled, the first transistor TR1 and the second transistor TR2 may be turned on simultaneously or together or may be turned off simultaneously or together, so that an error may occur in the output signal.

Referring to FIG. 4, an inverter 100 may include, among other things, active regions 102 and 103 formed on a semiconductor substrate 101 and a gate pattern 110 intersecting the active regions 102 and 103. Dummy gate patterns 111 may be disposed on both sides of the gate pattern 110, and a first power line 120 and a second power line 130 may be disposed above and below the gate pattern 110.

In an example embodiment illustrated in FIG. 4, a first power voltage VDD may be supplied to the first power line 120, and a second power voltage VSS may be supplied to the second power line 130. The first active region 102 may provide the first transistor TR1 together with the gate pattern 110, and the second active region 103 may provide the second transistor TR2 together with the gate pattern 110. One side of the first active region 102 may be connected to the first power line 120 through an active contact 140 and a wiring pattern 150, and the other side of the first active region 102 may be connected to the second active region 103 through the active contact 140 and the wiring pattern 150. Similarly, one side of the second active region 103 may be connected to the second power line 130 through the active contact 140 and the wiring pattern 150, and the other side of the second active region 103 may be connected to the first active region 102 through the active contact 140 and the wiring pattern 150. An input node IN may be connected to the gate pattern 110, and an output node OUT may be connected to a wiring pattern 150 connecting the first active region 102 and the second active region 103 to each other.

In an example embodiment, the electrical characteristics of the first transistor TR1 and the second transistor TR2 may be determined according to the depth of the active regions 102 and 103 included in each of the first transistor TR1 and the second transistor TR2, the thickness of the gate insulating film, the length of effective channel, and the like. However, even if layout data is generated as shown in FIG. 4, the inverter 100 actually formed due to process parameters actually controlling the semiconductor fabrication process and errors occurring during the fabrication process may not fully match the layout data. Accordingly, the inverter 100 may not possess the desired electrical characteristics.

According to some embodiments of the inventive concept, the electrical characteristics of the semiconductor device may be predicted using a predetermined simulation tool before proceeding with the actual semiconductor fabrication process. For example, design parameters generated from layout data as shown in FIG. 4 and process parameters for controlling a semiconductor process for manufacturing the inverter 100 may be input to the simulation tool, and electrical characteristics of the first transistor TR1 and the second transistor TR2 included in the inverter 100 can be predicted. However, this method may be time consuming and costly and may lower the overall efficiency of the fabrication process.

In an example embodiment of the present inventive concept, electrical characteristics of a semiconductor device, such a field effect transistor, may be quickly predicted using a machine learning model. Design variables and/or process variables set as arbitrary initial values may be input to the machine learning model in which training is completed to predict electrical characteristics of semiconductor devices, and at least portions of the design variables and/or processes may be modified until the electrical characteristics of the semiconductor devices match target data. When the machine learning model performs training using a sample data set obtained by simulations using the simulation tool, it may take a relatively long time to train the machine learning model, but after the training is completed, the electrical characteristics of various semiconductor devices may be quickly checked and design variables and/or process variables can be optimized. Therefore, the efficiency of the overall semiconductor fabrication process can be improved and costs can be reduced.

Figure 5:
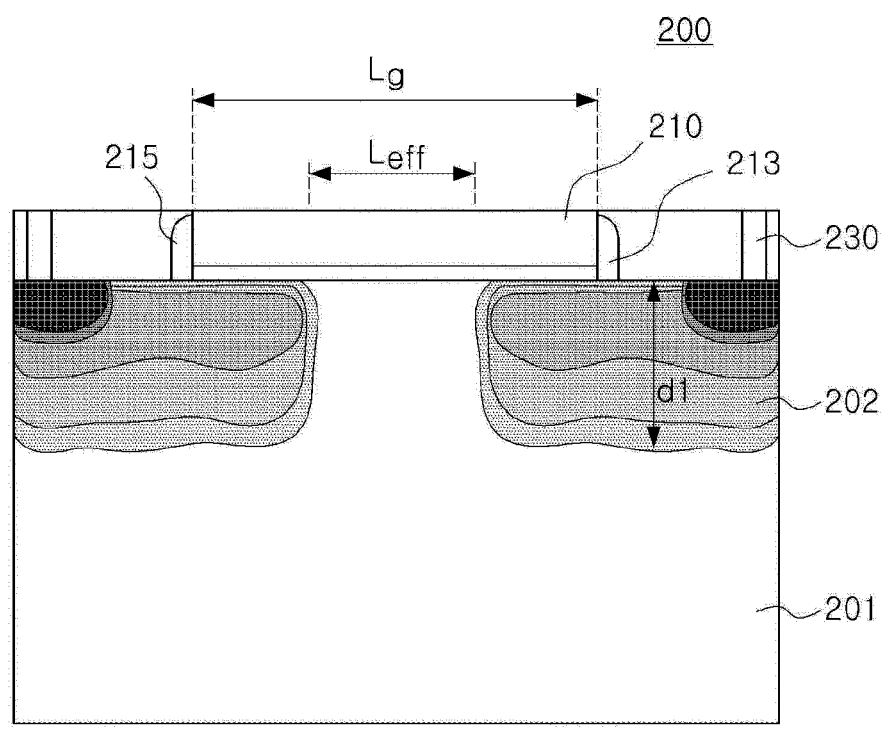
FIGS. 5 and 6 are cross-sectional views that illustrate design parameters of a semiconductor device according to an example embodiment of the present inventive concept.
Figure 6:
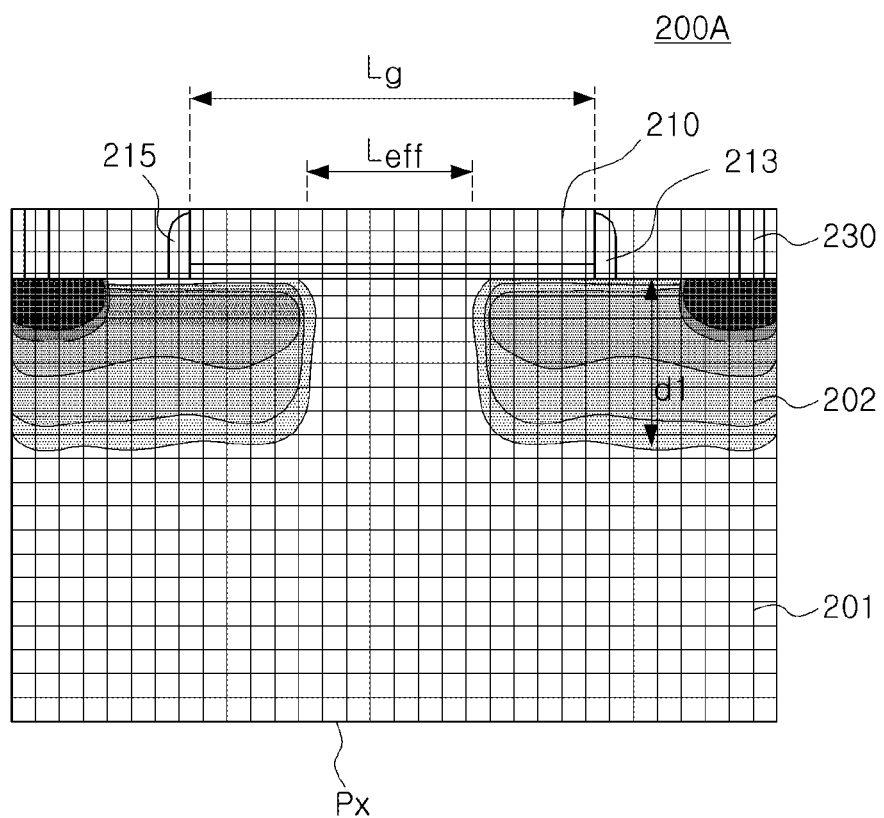

FIGS. 5 and 6 are cross-sectional views that illustrate design parameters of a semiconductor device according to an example embodiment of the present inventive concept.

Referring to FIG. 5, a semiconductor device, which may be included with one or more semiconductor devices in an integrated circuit, according to an example embodiment of the present inventive concept may be a field effect transistor, and may include, among other things, a source/drain region 202 formed on a semiconductor substrate 201, a gate pattern 210 formed on the semiconductor substrate 201. A gate insulating film 213 may be formed between the gate pattern 210 and the semiconductor substrate 201, and an active contact 230 may be connected to the source/drain region 202. A gate spacer 215 may be formed on both sides of the gate pattern 210.

Design parameters of the field effect transistor may include an effective channel length ($L_{eff}$), a gate length ($L_g$), a thickness ($T_{ox}$) of the gate insulating film 213, a junction depth (d1) of the source/drain regions 202, and the like. Process parameters of the field effect transistor may include conditions of an ion implantation process for forming the source/drain region 202, a temperature of a process for forming the gate insulating film 213, and the like. At least one of the design parameters and process parameters may be input to the machine learning model as input data.

The image data 200 shown in FIG. 5 may be output data of a machine learning model receiving at least one of the design parameters and process parameters. Therefore, using the image data 200, main parameters determining the electrical characteristics of the field effect transistor, for example, at least one of the effective channel length ($L_{eff}$), the gate length ($L_g$), the thickness ($T_{ox}$) of the gate insulating film 213, and the junction depth d1 may be determined. For example, process parameters including main process conditions of the ion implantation process may be input into a machine learning model, and the junction depth d1 may be obtained from image data 200 output from the machine learning model. Using the junction depth d1 measured from the image data 200, whether the process parameters of the ion implantation process are appropriate (i.e., results in a semiconductor device having desired electrical characteristics) may be determined.

For example, the process parameters including main process conditions may be input into a simulation tool, and the junction depth may be determined using the output of the simulation tool. In addition, the same process parameters may be input to the machine learning model, and a junction depth d1 may be obtained from the image data 200 output by the machine learning model. In this case, according to a difference between the junction depth output from the simulation tool and the junction depth d1 output from the machine learning model, whether the machine learning model continues the training process or whether to terminate the training process may be determined.

To compare the junction depth output from the simulation tool with the junction depth d1 appearing in the image data 200 output from the machine learning model, an evaluation of a boundary of the source/drain region 202 in the image data 200 output from the machine learning model may be performed. In an example embodiment of the present inventive concept, as shown in FIG. 6, image data 200A to which coordinate information of pixels PX output from the machine learning model is added may be used in the training process of the machine learning model. In the example embodiment shown in FIG. 6, the image data 200A may further include coordinate information according to the horizontal and vertical directions of the pixels PX as an additional domain. Accordingly, predictive data, such as a junction depth (d1), a thickness ($T_{ox}$) of the gate insulating film 213, a gate length ($L_g$), and an effective channel length ($L_{eff}$) can be accurately selected from the image data output from the machine learning model.

Thus, some embodiments of the inventive concept may provide a machine learning model that can be used to generate proposed values for the main parameters representing the electric characteristics of the field effect transistor, including, for example, the threshold voltage of the field effect transistor, the on current and the off current, a current-voltage curve defining a relationship between the drain current and the drain voltage according to the gate voltage input to the gate pattern 210 of the field effect transistor. The machine learning model according to an example embodiment of the present inventive concept may receive design parameters and/or process parameters of a field effect transistor as input data, and may output predictive data for electrical characteristics of the semiconductor device(s). Such electrical characteristics are described in more detail with reference to FIGS. 7 and 8.

Figures 7, 8:
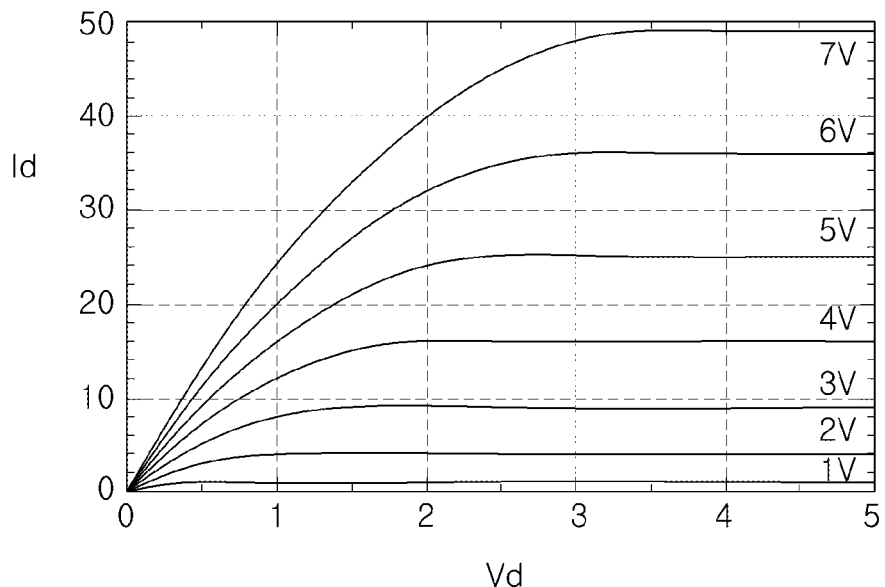
FIGS. 7 and 8 are a graph and a table, respectively, that illustrate electrical characteristics of a semiconductor device according to an example embodiment of the present inventive concept.

FIGS. 7 and 8 are a graph and a table, respectively, that illustrate electrical characteristics of a semiconductor device according to an example embodiment of the present inventive concept.

In FIGS. 7 and 8, the semiconductor device included in an integrated circuit device may be a field effect transistor. FIG. 7 is a graph showing a current-voltage curve according to a gate voltage of a field effect transistor. Referring to FIG. 7, characteristics of a drain voltage and a drain current according to a bias condition of a gate voltage are illustrated. As the gate voltage increases and the drain voltage increases, the drain current may increase. Meanwhile, regardless of the bias condition of the gate voltage, when the drain voltage increases above a predetermined threshold voltage, the drain current may not increase any further and may be saturated.

Reference data used for training a machine learning model may be provided by a simulation tool as described above. For example, the simulation tool may receive process parameters and/or design parameters and output reference data corresponding to the voltage-current curve as illustrated in FIG. 7. In addition, the machine learning model may also receive process parameters and/or design parameters and output predictive data corresponding to a voltage-current curve as illustrated in FIG. 7.

However, to accurately compare the reference data and the predictive data, it may be necessary to accurately match a bias condition of voltages affecting a drain current, which is an output current, a bias condition of a gate voltage and a bias condition of a drain voltage. In an example embodiment of the present inventive concept, as shown in FIG. 8, values of the drain current according to a drain voltage Vd and a gate voltage Vg may be expressed in a form of a two-dimensional array. In other words, the value of the drain current included in the reference data is represented in a form of two-dimensional array according to the drain voltage Vd and the gate voltage Vg, and the value of the drain current included in the predictive data is represented in a form of two-dimensional array according to the drain voltage Vd and the gate voltage Vg, and then compared with each other. Accordingly, by using the drain voltage Vd as a first coordinate in the horizontal direction and the gate voltage Vg as a second coordinate in the vertical direction, it is possible to accurately compare the drain currents included in the reference data and the predictive data, respectively.

Figure 9:
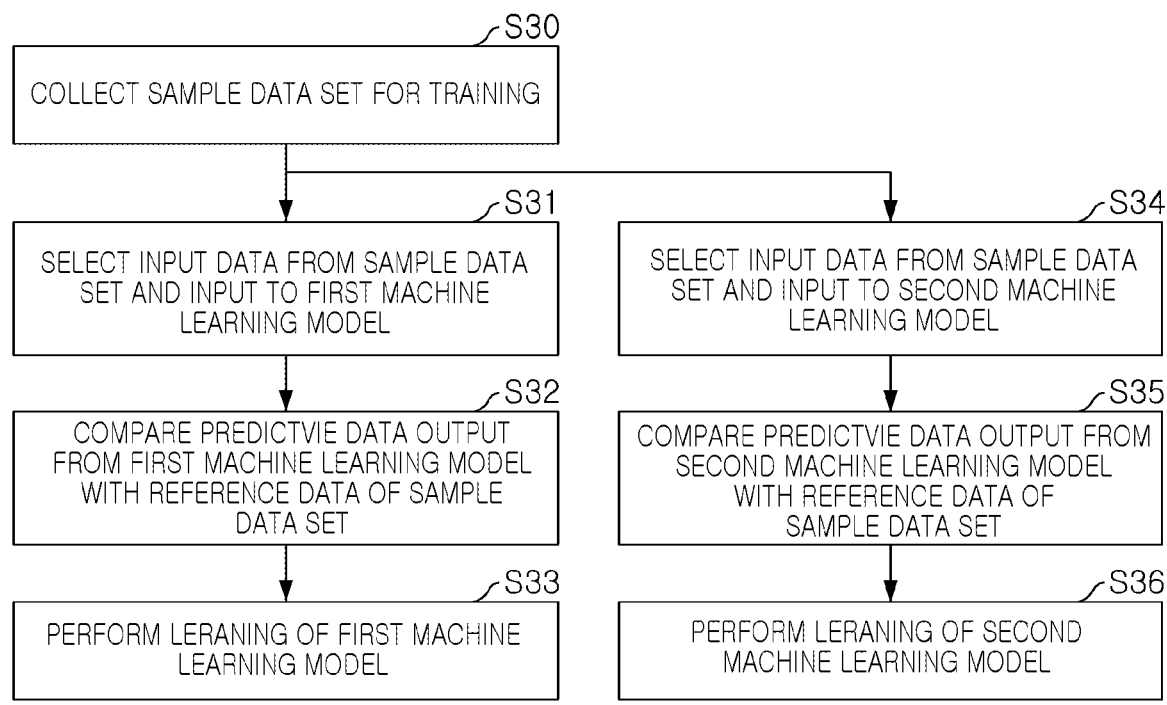
FIGS. 9 and 10 are flowcharts that illustrate a method of training a machine learning model for predicting electrical characteristics of semiconductor devices formed in a semiconductor fabrication process according to an example embodiment of the present inventive concept.
Figure 10:
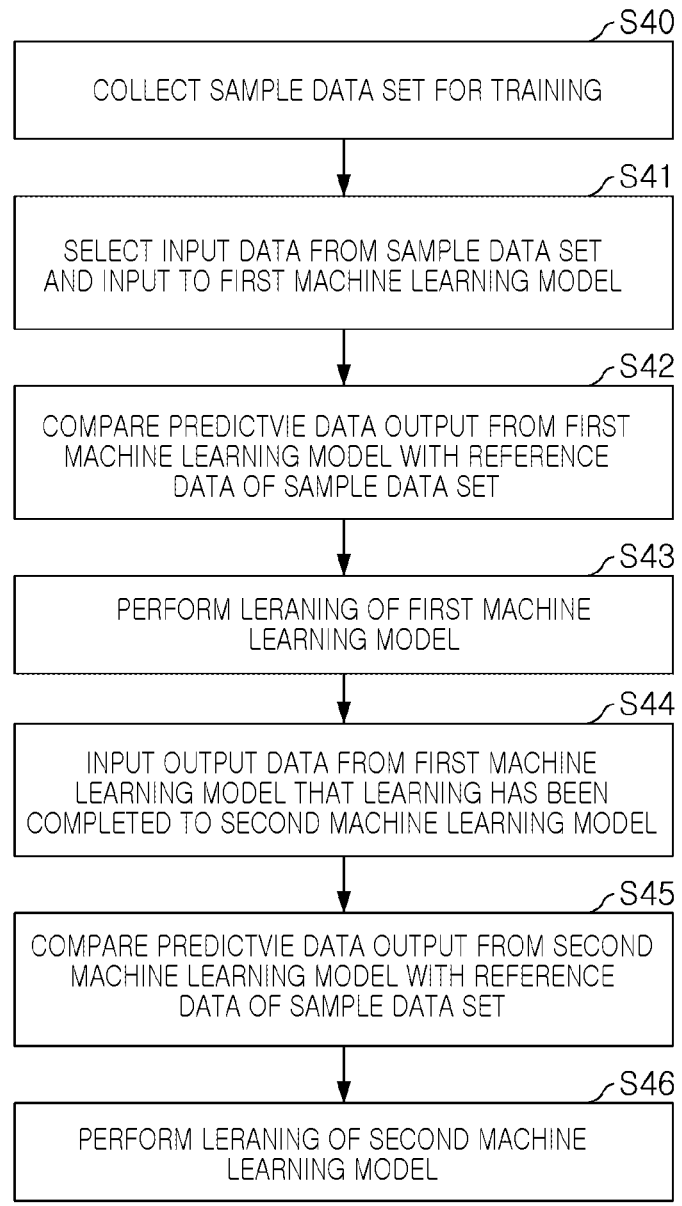
Figure 11:
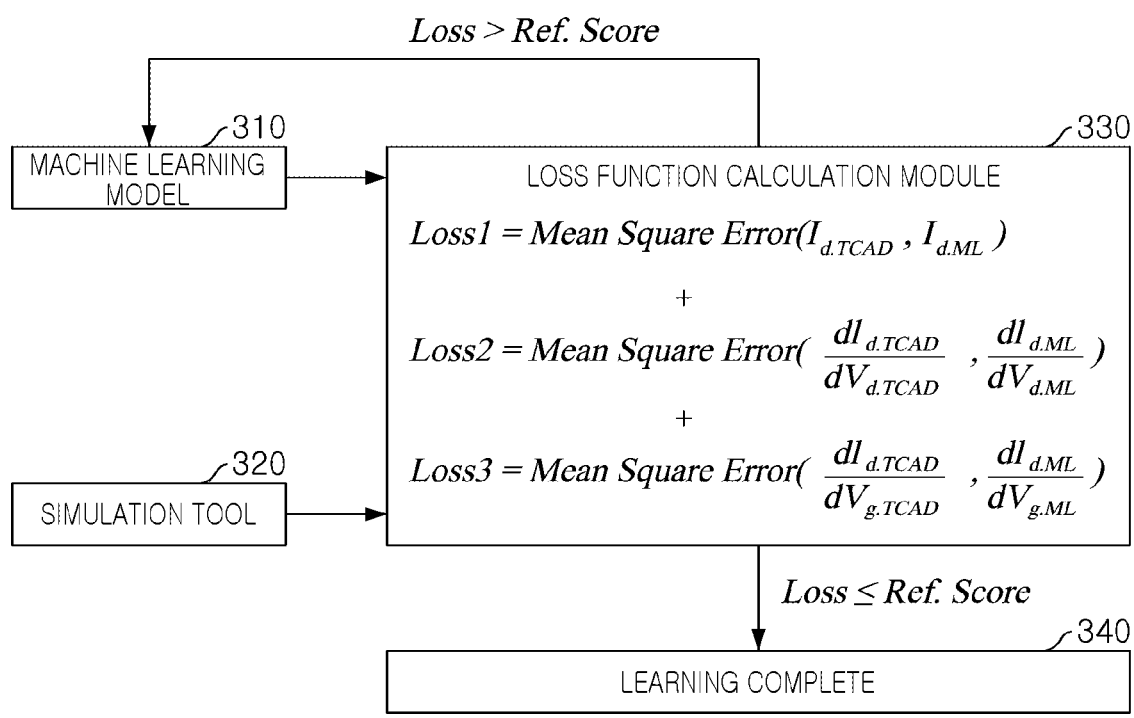
FIG. 11 is a block diagram that illustrates training a machine learning model for predicting electrical characteristics of semiconductor devices formed in a semiconductor fabrication process according to an example embodiment of the present inventive concept.

FIGS. 9 and 10 are flowcharts that illustrate a method of training a machine learning model for predicting electrical characteristics of semiconductor devices formed in a semiconductor fabrication process according to an example embodiment of the present inventive concept. FIG. 11 is a block diagram that illustrates training a machine learning model for predicting electrical characteristics of semiconductor devices formed in a semiconductor fabrication process according to an example embodiment of the present inventive concept.

First, referring to FIG. 9, operations of a method of training a machine learning model according to an example embodiment of the present inventive concept may begin by collecting a sample data set for training (S30). The sample data set for training can be collected by using a simulation tool based on a physical model. For example, process parameters for controlling a semiconductor process and design parameters representing a structure of a semiconductor device to be formed by a semiconductor process may be input into a simulation tool, and reference data representing characteristics of the semiconductor device may be obtained. Process parameters and reference data corresponding thereto, and design parameters and reference data corresponding thereto may be included in the sample data set.

When the sample data set is collected, input data may be selected from the sample data set and input to a first machine learning model (S31). For example, input data input to the first machine learning model may be process parameters. The first machine learning model receiving process parameters may output predictive data representing electrical characteristics of semiconductor devices formed by performing a semiconductor process based on the process parameters.

The predictive data output from the first machine learning model may be compared with reference data of the sample data set (S32). For example, the predictive data may be image data representing a cross-sectional structure of a semiconductor device as described with reference to FIGS. 5 and 6. At block S32, to accurately compare the predictive data and the reference data, coordinates of pixels may be added to the predictive data output from the first machine learning model. Information, such as the junction depth, the thickness of the gate insulating film, and the like, can be accurately extracted from the predictive data using the coordinates of the pixels, which can be compared with the reference data.

The first machine learning model may perform training using the comparison result of block S32 (S33). For example, when the junction depth appearing in the predictive data is smaller than the junction depth included in the reference data, a filter of the convolutional neural network included in the first machine learning model, a weight applied to hidden nodes, or the like, may be adjusted so that image data having a greater junction depth is output from the same process parameters. Training the first machine learning model may be performed using a plurality of sample data sets to increase the reliability of the first machine learning model and reduce or prevent errors due to bias due to a specific condition.

Input data may be selected from the sample data set and input to a second machine learning model (S34). For example, input data input to the second machine learning model may be design parameters. For example, the second machine learning model receiving design parameters may output predictive data representing electrical characteristics of semiconductor devices having structures according to the design parameters.

The predictive data output from the second machine learning model may be compared with reference data of the sample data set (S34). For example, the predictive data may be a graph of a current-voltage curve representing electrical characteristics of a semiconductor device as described with reference to FIGS. 7 and 8. As described above, to accurately compare the predictive data and the reference data, the predictive data output from the second machine learning model may be transformed into a two-dimensional array form instead of a graph. For example, as illustrated in FIG. 8, the drain current included in the predictive data and the drain current included in the reference data may be accurately compared using each of the drain voltage and the gate voltage as coordinates.

The second machine learning model may perform training by using the comparison result of block S35 (S36). For example, when the drain current included in the predictive data and the drain current included in the reference data are different under the same drain voltage and gate voltage conditions, the second machine learning model may perform training to output the same drain current as the reference data from the same design parameters. As described above, as an example, a filter of a convolutional neural network included in the second machine learning model, weights applied to hidden nodes, and the like may be adjusted. Similar to the first machine learning model, training of the second machine teaming model may be performed using a plurality of sample data sets to increase the reliability of the second machine learning model and reduce or prevent errors due to bias due to a specific condition.

Next, in the example embodiment illustrated in FIG. 10, the first machine learning model and the second machine learning model may sequentially perform training. Referring to FIG. 10, first, a sample data set for training may be collected (S40). An operation of collecting the sample data set may be similar to the example embodiment described above with reference to FIG. 9.

Next, input data may be selected from the sample data set and input to the first machine learning model (S41). The input data input to the first machine learning model may be process parameters input to a simulation tool in a process of collecting a sample data set. The first machine learning model receiving process parameters may output predictive data representing a result of the process. As described above with reference to FIG. 9, the predictive data may include a junction depth determined by a process, a thickness of a gate dielectric film, an effective channel length, a gate length, and the like.

The predictive data may be compared with reference data (S42). The reference data is data included in the sample data set, and may be data obtained by inputting process parameters into a simulation tool. For example, among the data obtained by inputting process parameters into the simulation tool, the junction depth, the thickness of the gate dielectric film, the effective channel length, the gate length, and the like, as examples above, may be selected as reference data, and the predictive data output by the first machine learning model may be compared with the reference data. The first machine learning model may perform training based on the comparison result (S43). The training process of the first machine learning model may be understood similarly to the example embodiment described with reference to FIG. 9 above.

When the training of the first machine learning model is completed, an output of the first machine learning model for which training has been completed may be input to a second machine learning model (S44). In an example embodiment, the output of the first machine learning model may include a junction depth determined by a process, a thickness of a gate dielectric film, an effective channel length, a gate length, and the like, and accordingly, a physical structure of a semiconductor device may be expressed. The second machine learning model may receive an output of the first machine learning model representing the physical structure of the semiconductor device and output predictive data representing electrical characteristics of the semiconductor device.

For example, the predictive data output from the second machine learning model may include a threshold voltage, a current-voltage characteristic, an on current, an off current of a semiconductor device, and the like. The predictive data output from the second machine learning model may be compared with reference data of the sample data set (S45), and the second machine learning model may perform training according to the result thereof (S46). For example, when the threshold voltage of the semiconductor device output by the second machine learning model as predictive data is different from the threshold voltage included in the reference data, training of the second machine learning model may be performed so that the same threshold voltage as the reference data is output. The training process of the second machine learning model may be understood similarly to the embodiment described with reference to FIG. 9 above.

In the example embodiments described with reference to FIGS. 9 and 10, a loss function may be used for training machine learning models. For example, a mean squared error and/or a cross entropy error may be used as a loss function. In addition, in an example embodiment of the present inventive concept, when the semiconductor device is a field effect transistor, a relative relationship between a current and a voltage may be reflected in the loss function, in addition to an absolute value of die current and/or voltage. In an example embodiment, at least one of the plurality of loss functions may be used to calculate a difference between a transconductance calculated from predictive data output from a machine learning model and a transconductance calculated from reference data generated by a simulation tool. Such operations will be described in more detail with reference to FIG. 11. Referring to FIG. 11, outputs of a machine learning model 310 and a simulation tool 320 may be input to a loss function calculation module 330. As previously described with reference to FIGS. 9 and 10, the machine learning model 310 and the simulation tool 320 receiving the same process parameters and/or design parameters may output predictive data and reference data, respectively. The predictive data and the reference data may include data representing electrical characteristics of the semiconductor device.

For example, the predictive data and the reference data may include a drain voltage, which is a bias voltage applied to the field effect transistor, and a drain current according to die gate voltage. A first loss function Loss1 may be used to calculate a difference between drain currents ($I_{d,ML}$) included in the predictive data and drain currents ($I_{d,TCAD}$) included in the reference data by calculating a mean squared error.

A second loss function Loss2 may be used to perform a mean squared error operation using an output conductance corresponding to a reciprocal of output resistance, and a third loss function Loss3 may be used to perform a mean squared error operation using transconductance. Referring to FIG. 11, the second loss function Loss2 may be used to calculate a difference between output conductance $$\left(\frac{\Delta Id, ML}{\Delta Vd, ML}\right)$$

included in the predictive data and output conductance $$\left(\frac{\Delta Id, TCAD}{\Delta Vd, TCAD}\right)$$

included in the reference data by using the mean squared error operation. In addition, the third loss function Loss3 may be used to calculate a difference between the transconductance $$\left(\frac{\Delta Id, ML}{\Delta Vg, ML}\right)$$

included in the predictive data and the transconductance $$\left(\frac{\Delta Id, TCAD}{\Delta Vg, TCAD}\right)$$

included in the reference data by using the mean squared error operation.

A loss function calculation module 330 may calculate a loss value Loss by summing the results of each of the first to third loss functions Loss1 to Loss3, and may compare it with a reference score Ref. Score. If the loss value is greater than the reference score (Ref. Score the machine learning model 310 may repeat training, and lithe loss value is less than or equal to the reference score (Ref. Score), training of the machine learning model 310 may be completed.

Figure 12:
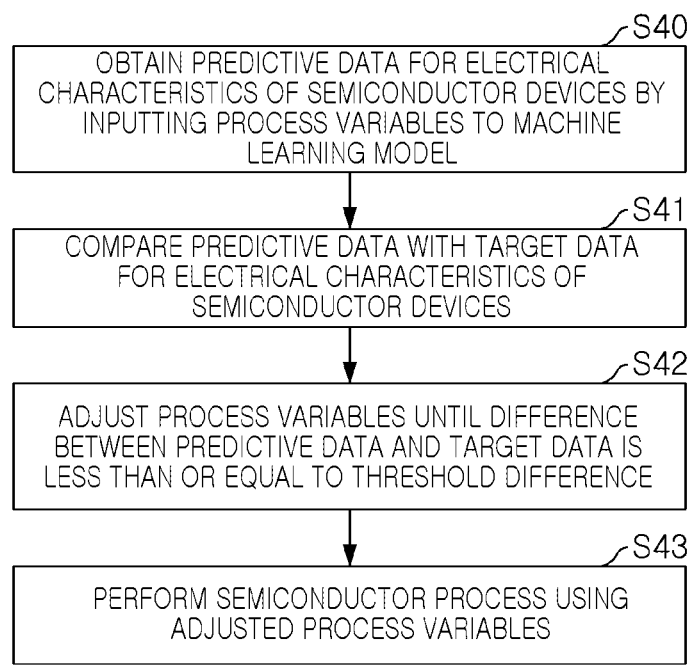
FIGS. 12 and 13 are flowcharts illustrating a method for manufacturing a semiconductor device according to an example embodiment of the present inventive concept.
Figure 13:
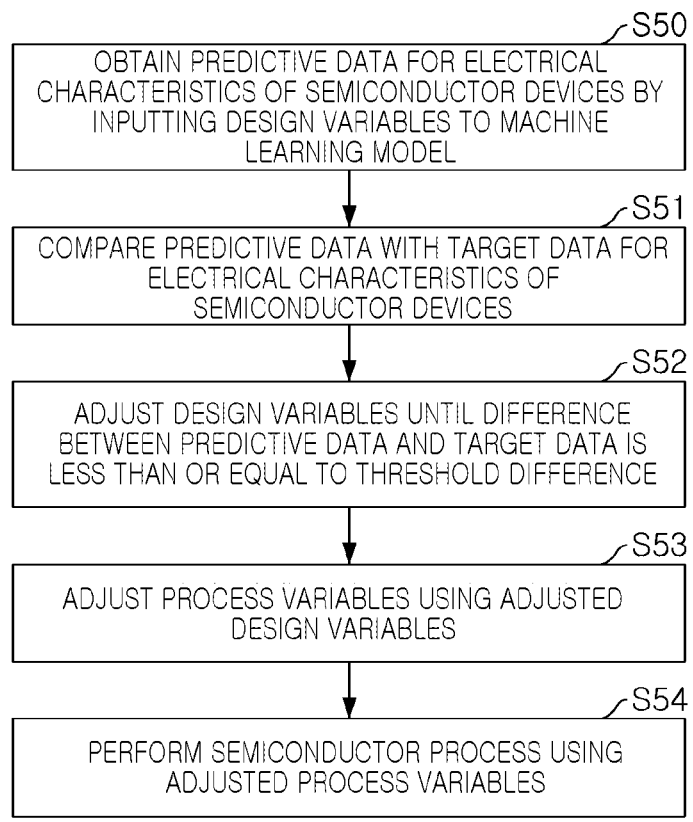

FIGS. 12 and 13 are flowcharts provided to describe a method of manufacturing a semiconductor device according to an example embodiment of the present inventive concept.

Referring to FIG. 12, operations of a method of manufacturing a semiconductor device according to an example embodiment of the present inventive concept may begin by inputting process variables into a machine learning model to obtain predictive data for electrical characteristics of semiconductor devices (S40). Process variables input to the machine learning model may be variables for controlling a semiconductor process. The machine learning model may be a model for which training has been completed using a sample data set generated by a simulation tool, and may receive process variables and output predictive data for electrical characteristics of semiconductor devices manufactured by a semiconductor fabrication process, such as a threshold voltage, an on current, an off current, and the like.

The predictive data output from the machine learning model at block S40 may be compared with target data for electrical characteristics (S41). For example, when the semiconductor device is a field effect transistor, in target data, a threshold voltage may be set as a first voltage and an off current may be set as a first current. In predictive data output from the machine learning model, the threshold voltage may be a second voltage, different from the first voltage, and the off current may be a second current, different from the first current.

In a manufacturing method according to an example embodiment of the present inventive concept, predictive data and target data may be compared (S41). For example, the threshold voltage of the predictive data and the threshold voltage of the target data may be compared, and the off current of the predictive data and the off current of the target data may be compared. In the above-described example, there may be a difference between the predictive data and the target data, and values of process variables may be adjusted until the difference between the predictive data and the target data is less than or equal to a threshold difference (S42). When the adjustment of the process variables is completed, a semiconductor fabrication process may be performed using the adjusted process variables (S43).

Next, referring to FIG. 13, operations of a method of manufacturing a semiconductor device according to an example embodiment or the present inventive concept may begin by inputting design variables into a machine learning model to obtain predictive dam for electrical characteristics of semiconductor devices (S50). Design variables input to the machine learning model may be variables representing structures of semiconductor devices. In an example embodiment, design variables may include critical dimensions of at least some of the structures included in the semiconductor devices. As described above with reference to FIG. 12, the machine learning model may be a model for which training has been completed, and may receive design variables and output predictive data for electrical characteristics of semiconductor devices manufactured by a semiconductor fabrication process.

When the predictive data is output, the predictive data may be compared with target data for electrical characteristics of the semiconductor device (S51). As described above with reference to FIG. 12, electrical characteristics such as a threshold voltage, an on current, an off current, and the like, may have different values in the predictive data and target data. In an example embodiment of the present inventive concept, values of design variables may be adjusted so that the difference between the predictive data and the target data becomes a predetermined threshold difference (S52). For example, a process of changing values of at least one of the design variables and re-entering it into the machine learning model, and comparing predictive data output from the machine learning model with target data may be repeated.

When the adjustment of the design variables is completed, process variables may be determined using the adjusted design variables (S53). The adjusted design variables can define semiconductor devices that can obtain the electrical characteristics defined in the target data. Therefore, values for process variables may be determined so that the semiconductor devices defined by the adjusted design variables can be manufactured, and semiconductor devices optimized for target data can be formed by performing a semiconductor fabrication process using the process variables (S54). Alternatively, data for manufacturing a semiconductor device, for example, layout data may be modified using the adjusted design variables.

Figure 14:
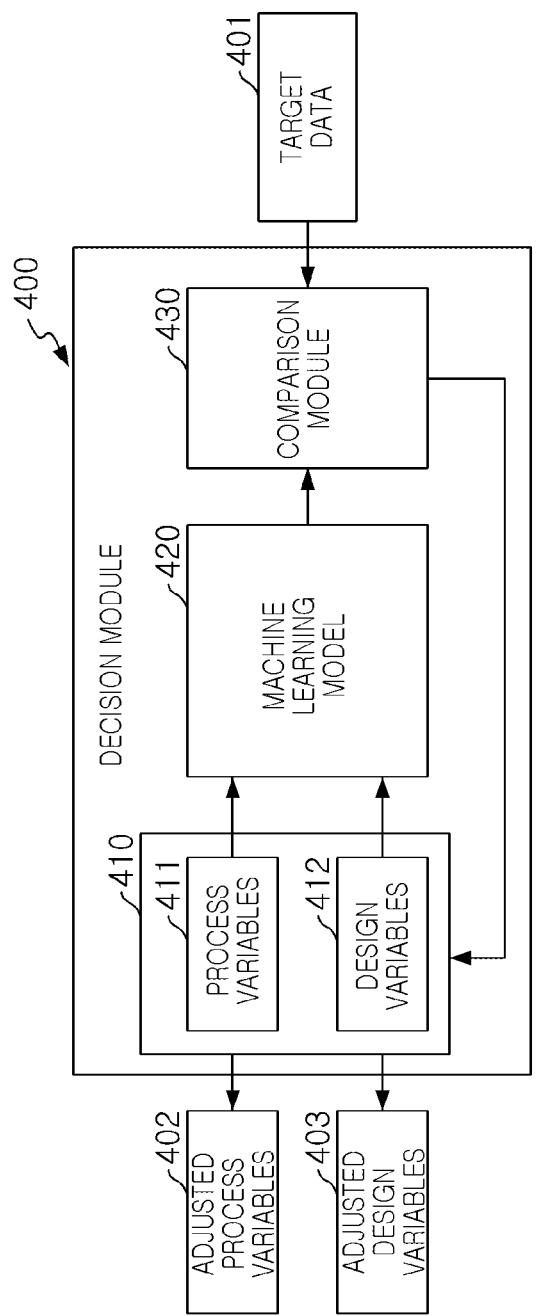
FIG. 14 is a block diagram that illustrates a machine learning architecture according to an example embodiment of the present inventive concept.
Figure 15:
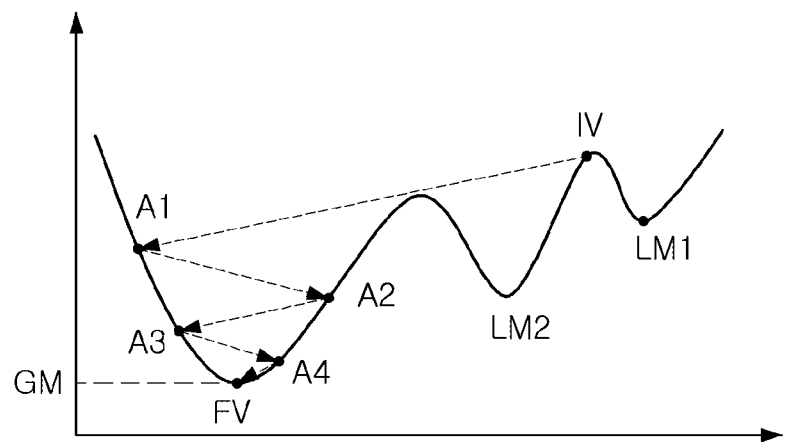
FIGS. 15 and 16 are graphs that illustrate a gradient descent algorithm for optimizing a process variable and/or a design variable according to some embodiments of the present inventive concept.
Figure 16:
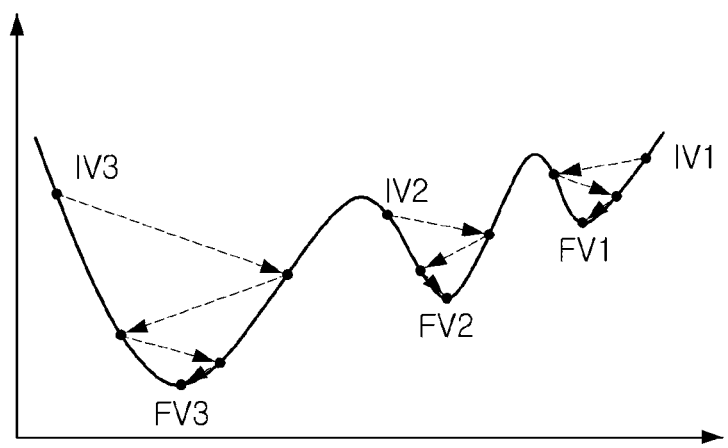

FIG. 14 is a block diagram that illustrates a machine learning architecture according to an example embodiment of the present inventive concept. FIGS. 15 and 16 are graphs that illustrate a gradient descent algorithm for optimizing a process variable and/or a design variable according to some embodiments of the present inventive concept.

Referring to FIG. 14, a decision model 400 may be applied to a method of manufacturing a semiconductor device according to an example embodiment of the present inventive concept. The decision model 400 is a module that is configured to adjust values of a process variable 411 and a design variable 412 used for manufacturing a semiconductor device, and may include an input module 410, a machine learning model 420 for which training has been completed according to the above-described example embodiments, a comparison module 430, and the like. In an example embodiment, the input module 410 may set the process variable 411 and the design variable 412 to arbitrary initial values.

When at least one of the process variable 411 and the design variable 412 set to an arbitrary initial value is input to the machine learning model 420, the machine learning model 420 may output predictive data for the electrical characteristics of the semiconductor device. The comparison module 430 may compare the predictive data and target data 401 and may transmit a comparison result to the input module 410. For example, the target data 401 may include device data corresponding to electrical characteristics of a semiconductor device included in the semiconductor device and process data corresponding to a process of manufacturing the semiconductor device. In an example embodiment, the device data may include a threshold voltage, an off current of a semiconductor device, an on current of a semiconductor device, and the like, and the process data may include a thickness of a gate insulating film, a channel length, a junction depth of the semiconductor device, and the like.

As a result of the comparison, if a difference between the predictive data and the target data 401 is greater than or equal to a predetermined threshold difference, the input module 410 may adjust values of the process variable 411 and/or the design variable 412. As a result of the comparison, if the difference between the predictive data and the target data 401 is less than a predetermined threshold difference, the input module 410 may output the values for the adjusted process variable 402 and the adjusted design variable 403.

To obtain the adjusted process variable 402 and the adjusted design variable 403 based on the target data 401 by using the machine learning model 420 trained in advance, the decision model 400 may use a predetermined optimization method. For example, the decision model 400 may optimize the process variable 411 and/or the design variable 412 using a genetic algorithm and/or a gradient descent algorithm.

FIGS. 15 and 16 are graphs that illustrate a gradient descent algorithm for optimizing a process variable and/or a design variable according to some embodiments of the present inventive concept. First, in the graphs shown in FIGS. 15 and 16, a horizontal axis may represent a process variable or a design variable whose values are to be adjusted, and a vertical axis may represent a difference between predictive data output by a machine learning model receiving the value of the process variable or design variable and target data.

First, referring to FIG. 15, a value process variable or a design variable may be set as an arbitrary initial value P1. When the process variable or the design variable has the initial value P1, there is a relatively large difference between the predictive data and the target data, so that the value of the process variable or the design variable may be transformed into a first adjusted value A1. As described above, the value(s) of the process variable and/or the design variable may pass through second to fourth adjustment values A2 to A4, and the difference between the predictive data and the target data may reach a final value FV having a global minimum value GM, so that optimization may be terminated.

However, in the example embodiment shown in FIG. 15, in a process of optimizing the process variable and/or the design variable, the process variable and/or the design variable may settle at a first local minimum value LM1 or a second local minimum value LM2, not the global minimum value GM of a loss function. In an example embodiment of the present inventive concept, two or more initial values may be set for a process variable or a design variable, and the process variable or the design variable may be optimized using a gradient descent algorithm. The gradient descent algorithm will be described in detail with reference to FIG. 16.

Referring to FIG. 16, first to third initial values IV1 to IV3 may be set for a process variable or a design variable. Hereinafter, for convenience of description, an example embodiment in which design variables are optimized will be described. For example, the design variable set as the first initial value IV1 may be adjusted to a first final value FV1, corresponding to the first local minimum value LM1, and the design variable set as the second initial value IV2 may be adjusted to a second final value FV2, corresponding to the second local minimum value LM2. In addition, the design variable set as the third initial value IV3 may correspond to a third final value FV3, corresponding to a global minimum value GM. Therefore, after the optimization using the gradient descent algorithm is terminated, a loss function may be adjusted to a final value having the smallest loss function, the third final value FV3 in the example embodiment shown in FIG. 16, such that the design variables settle at the local minimum values LM1 and LM2 of the loss function in the optimization process.

Figure 17:
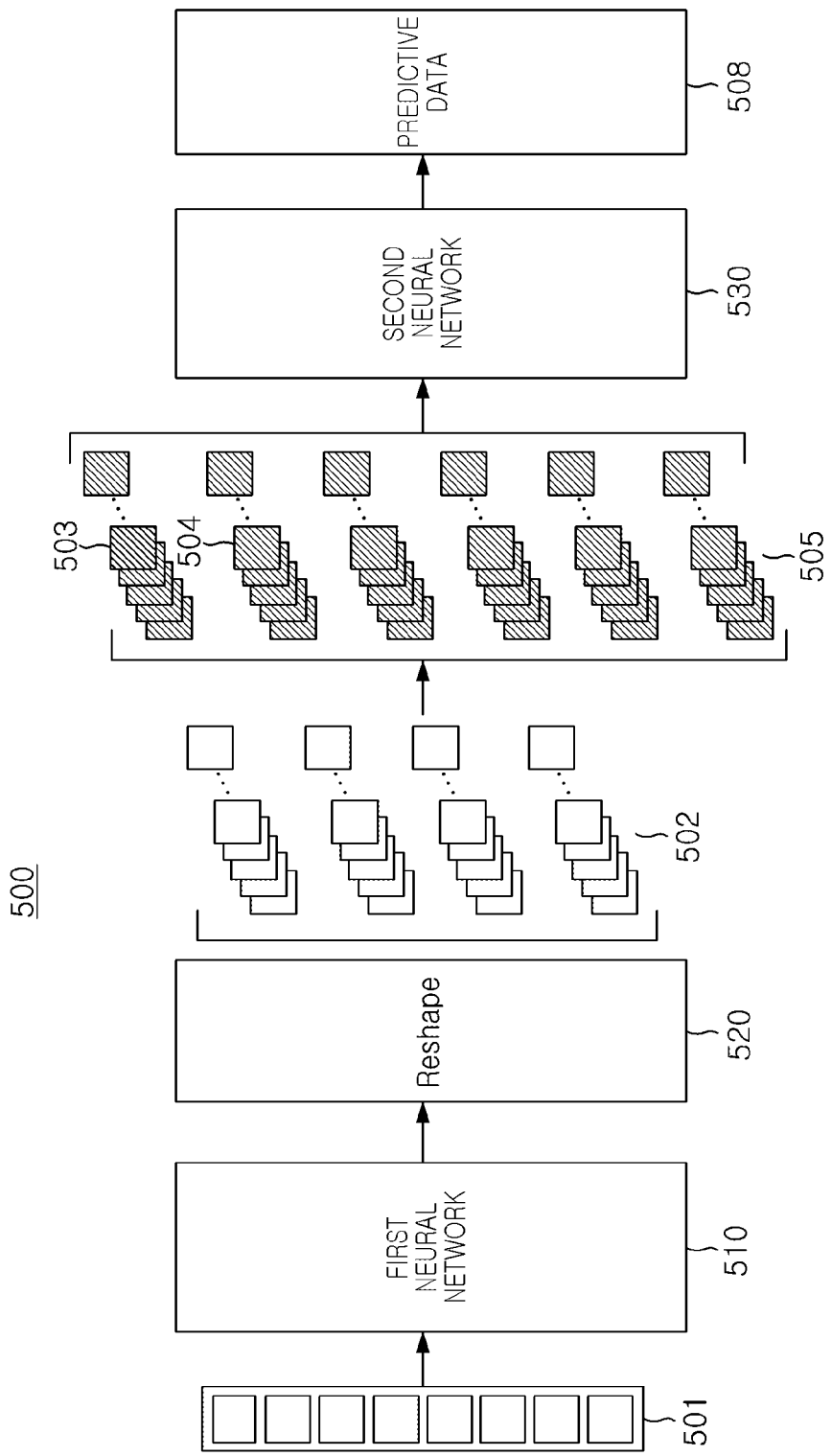
FIG. 17 is a block diagram that illustrates an artificial intelligence (AI) system for predicting electrical characteristics of semiconductor devices formed in a semiconductor fabrication process according to an example embodiment of the present inventive concept.

FIG. 17 is a block diagram that illustrates an artificial intelligence (AI) system including a machine learning model for predicting electrical characteristics of semiconductor devices formed in a semiconductor fabrication process according to an example embodiment of the present inventive concept.

Referring to FIG. 17, a machine learning model according to an example embodiment of the present inventive concept may include a first neural network 510, a reshape layer 520, a second neural network 530, and the like. However, the machine learning model described with reference to FIG. 17 is an example, and the machine learning model for implementing the method for predicting electrical characteristics of a semiconductor device according to an example embodiment of the present inventive concept may be implemented in various oilier ways.

The first neural network 510 may have a fully connected neural network structure. For example, input data 501 may be input to the first neural network 510, and the input data 501 may include process variables and/or design variables described above. The input data 501 processed by the first neural network 510 may be transformed into data of a different dimension by the reshape layer 520. For example, in the example embodiment shown in FIG. 17, one-dimensional data may be transformed into N-dimensional data 502 by the Reshape layer 520.

Next, coordinate data 503 and 504 may be added to the N-dimensional data 502 generated by the reshape layer 520 to generate N+2-dimensional intermediate data 505. As described above with reference to FIGS. 5 to 8, the coordinate data 503 and 504 may be data added to accurately determine the structure and electrical characteristics of the semiconductor device. For example, the first coordinate data 503 may be a horizontal coordinate of pixels or a drain voltage, and the second coordinate data 504 may be a vertical coordinate of pixels or a gate voltage.

The intermediate data ay be input to the second neural network 530. For example, the second neural network 530 may include a convolutional neural network, and predictive data 508 output from the second neural network 530 may include data on the structure and/or electrical characteristics of the semiconductor device formed according to the process variables and/or design variables of the input data 501. For example, the predictive dam 508 may include a channel length of a semiconductor device, a thickness of a gate insulating film, a threshold voltage, drain current at turn-on, a drain current at turn-off, and the like.

The predictive data 508 may be used to optimize process variables and/or design variables included in the input data 501. For example, the predictive data 508 may be compared with target data of semiconductor devices, and an error between the predictive data 508 and the target data may be calculated using a loss function. By adjusting the process variable and/or design variable until the error calculated by the loss function reaches a low or minimum value, it is possible to optimize the process variable and/or design variable, and to manufacture a semiconductor device having the desired structure and/or electrical characteristics.

Figure 18:
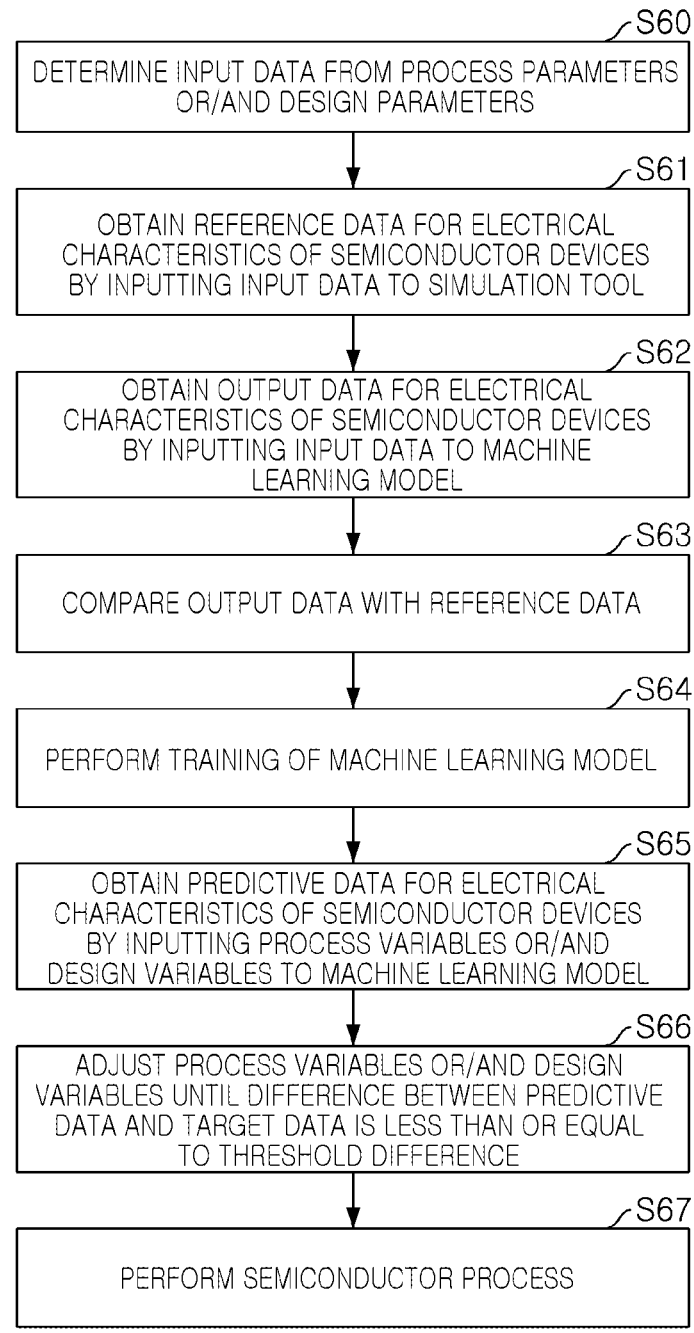
FIG. 18 is a flowchart illustrating a method for manufacturing a semiconductor device according to an example embodiment of the present inventive concept.

FIG. 18 is a flowchart illustrating a method of manufacturing a semiconductor device according to an example embodiment of the present inventive concept.

Referring to FIG. 18, operations of a method of manufacturing a semiconductor device according to an example embodiment of the present inventive concept may begin by determining input data from process parameters and/or design parameters (S60). Process parameters may be parameters for controlling a process of manufacturing semiconductor devices, and design parameters may be parameters representing structures of semiconductor devices.

Input data may be input to a simulation tool based on a physical model, and the simulation tool may output reference data representing characteristics of semiconductor devices (S61). For example, the reference data may include data representing the structure and/or electrical characteristics of semiconductor devices.

Input data may be input to a machine learning model. The machine learning model may generate output data representing characteristics of semiconductor devices by using the input data (S62). Output data of the machine learning model may be compared with reference data generated by the simulation tool (S63). Far example, a loss value may be obtained by inputting output data and reference data to a predetermined loss function, and the machine learning model may perform training until the loss value becomes less than or equal to a predetermined reference score (S64).

When the training is completed, process variables and/or design variables may be input to the machine learning model to obtain predictive data for characteristics of semiconductor devices (S65). The predictive data may include data corresponding to the structure and/or electrical characteristics of semiconductor devices. For example, when the semiconductor device is a field effect transistor, the predictive data may include a junction depth of the electrical field effect transistor, a thickness of a gate insulating film, a channel length, a drain current according to a bias condition of a drain voltage and a gate voltage, a threshold voltage, and the like.

When the predictive data is obtained, values for process variables and/or design variables may be adjusted (S66). For example, target data for semiconductor devices may be compared with predictive data, and values for process variables and/or design variables may be adjusted using an error or difference between the target data and the predictive data. As described above, using a genetic algorithm or a gradient descent algorithm, values for process variables and/or design variables may be adjusted until an error between the target data and the predictive data has a global minimum value. When the adjustment of the values of the process variables and/or the design variables is completed, the semiconductor fabrication process may be performed using the adjusted process variables and/or the adjusted design variables (S67).

As set forth above, according to an example embodiment of the present inventive concept, a machine teaming model may be used to generate output data representing characteristics of semiconductor devices using a sample data set obtained using a simulation tool. By inputting values for process variables and design variables to the trained machine learning model, it is possible to obtain predictive data for the electrical or physical characteristics of semiconductor devices, and adjust the values of the process variables and design variables so that the predictive data matches the target data for the characteristics of the semiconductor devices. Accordingly, a simulation method for predicting characteristics of semiconductor devices can be efficiently performed, and semiconductor devices having desired electrical characteristics can be manufactured.

The various and advantageous advantages and effects of the present inventive concept are not limited to the above description, and can be more easily understood in the course of describing a specific embodiment of the present inventive concept.

While example embodiments have been shown and described above, it will be apparent to those skilled in the art that modifications and variations could be made without departing from the scope of the present inventive concept as defined by the appended claims.

What is claimed is:

1. A simulation method for a semiconductor fabrication process, comprising:
obtaining, as input data, process parameters for controlling a semiconductor process of manufacturing semiconductor devices and design parameters representing a structure of the semiconductor devices;
generating predictive data for electrical characteristics of the semiconductor devices using a machine learning model based on the input data;
generating reference data for the electrical characteristics of the semiconductor devices using a simulation tool based on the input data;
training the machine learning model using the predictive data and the reference data, wherein the machine learning model comprises a first machine learning model configured to receive the process parameters and to output the design parameters representing a structure of the semiconductor devices, and a second machine learning model configured to receive the design parameters and to output the predictive data;
performing the semiconductor fabrication process using the output of the first machine learning model and the output of the second machine learning model.

2. The simulation method for the semiconductor fabrication process of claim 1, wherein the semiconductor devices comprise a field effect transistor, and the design parameters comprise at least a portion of a gate length, an effective channel length, a thickness of a gate insulating layer, and a junction depth of the field effect transistor.

3. The simulation method for the semiconductor fabrication process of claim 1, wherein the semiconductor devices comprise a field effect transistor, and the electrical characteristics comprise at least one of a drain current according to a drain voltage and a gate voltage of the field effect transistor, and transconductance.

4. The simulation method for the semiconductor fabrication process of claim 3, wherein the predictive data and the reference data comprise a drain current according to a drain voltage and a gate voltage of the field effect transistor as a 2D array information.

5. The simulation method for the semiconductor fabrication process of claim 1, wherein the machine learning model comprises a convolutional neural network, and the convolutional neural network is configured to receive image data corresponding to cross-sections of the semiconductor devices, and coordinate information of pixels included in the image data.

6. The simulation method for the semiconductor fabrication process of claim 5, wherein the image data is at least a portion of an image output from the simulation tool.

7. The simulation method for the semiconductor fabrication process of claim 1, wherein training of the first machine learning model and training of the second machine learning model are performed simultaneously.

8. The simulation method for the semiconductor fabrication process of claim 1, wherein, the second machine learning model is trained responsive to completion of training of the first machine learning model.

9. A simulation method for a semiconductor fabrication process comprising:
generating predictive data for electrical characteristics of semiconductor devices using a machine learning model based on input data comprising process variables for controlling a semiconductor fabrication process and design variables representing a structure of the semiconductor devices;

training the machine learning model using the predictive data and the reference data, wherein the machine learning model comprises a first machine learning model configured to receive the process parameters and to output the design parameters representing a structure of the semiconductor devices, and a second machine learning model configured to receive the design parameters and to output the predictive data;

comparing the predictive data with target data for the electrical characteristics of the semiconductor devices;

adjusting one of the process variables, or one of the design variables, or both of the one of the process variables and the one of the design variables, such that a difference between the predictive data and the target data is less than or equal to a predetermined threshold difference; and performing the semiconductor fabrication process using the one of the process variables that was adjusted, or the one of the design variables that was adjusted, or both of the one of the process variables that was adjusted and the one of the design variables that was adjusted.

10. The simulation method for the semiconductor fabrication process of claim 9, wherein the one of the process variables or the one of the design variables is adjusted using a gradient descent algorithm or a genetic algorithm.

11. The simulation method for the semiconductor fabrication process of claim 10, wherein the one of the process variables or the one of the design variables has two or more initial values in the gradient descent algorithm.

12. The simulation method for the semiconductor fabrication process of claim 9, wherein the semiconductor devices comprise a field effect transistor, and the electrical characteristics comprise a threshold voltage, an on current, or an off current of the field effect transistor.

13. A method for manufacturing a semiconductor device comprising:

generating output data representing characteristics of semiconductor devices using a machine learning model based on input data comprising process parameters for controlling a semiconductor process of manufacturing the semiconductor devices and design parameters representing a structure of the semiconductor devices;

generating reference data for the electrical characteristics of the semiconductor devices using a simulation tool based on the input data;

training the machine learning model using the output data and the reference data, wherein the machine learning model comprises a first machine learning model configured to receive the process parameters and to output the design parameters representing a structure of the semiconductor devices, and a second machine learning model configured to receive the design parameters and to output the predictive data;

adjusting one of the process variables, or one of the design variables, or both of the one of the process variables and the one of the design variables until a difference between target data for the electrical characteristics of the semiconductor devices and the predictive data is less than or equal to a predetermined threshold difference; and performing the manufacturing process by using the one of the process variables that was adjusted, the one of the design variables that was adjusted, or both of the one of the process variables that was adjusted and the one of the design variables that was adjusted.

14. The method for manufacturing the semiconductor device of claim 13, further comprising:

generating the predictive data for the electrical characteristics of the devices using the machine learning model that has been trained based only on the design variables;

adjusting the process variables based on the adjusted design variables; and performing the manufacturing process using the adjusted process variables.

15. The method for manufacturing the semiconductor device of claim 13, wherein the design variables comprise critical dimensions of at least a portion of the structures included in the semiconductor devices.

16. The method for manufacturing the semiconductor device of claim 13, further comprising:

modifying at least a portion of layout data for manufacturing the semiconductor device using the one of the design variables that was adjusted.

17. The method for manufacturing the semiconductor device of claim 13, wherein the simulation tool is configured to output image data representing a physical structure of the semiconductor devices or I-V characteristics of the semiconductor devices.

18. The method for manufacturing the semiconductor device of claim 17, wherein the semiconductor devices comprise a field effect transistor, and the I-V characteristic comprises an output current according to a bias voltage of the field effect transistor.

* * * * *